United States Patent [19]
Johansson et al.

[11] Patent Number: 5,684,326
[45] Date of Patent: Nov. 4, 1997

[54] EMITTER BALLAST BYPASS FOR RADIO FREQUENCY POWER TRANSISTORS

[75] Inventors: Ted Johansson, Hagersten, Sweden; Larry Leighton, Santa Cruz, Calif.

[73] Assignee: Telefonaktiebolaget L.M. Ericsson, Stockholm, Sweden

[21] Appl. No.: 393,683

[22] Filed: Feb. 24, 1995

[51] Int. Cl.$^6$ .................. H01L 27/082; H01L 27/102; H01L 29/70

[52] U.S. Cl. .................. 257/582; 257/581; 257/592; 257/578; 257/538

[58] Field of Search .................. 257/538, 578, 257/581, 582, 592

[56] References Cited

U.S. PATENT DOCUMENTS

| | | | |
|---|---|---|---|
| 3,918,080 | 11/1975 | Kerr | 357/36 |
| 4,611,882 | 9/1986 | Ushida | 357/80 |
| 4,788,584 | 11/1988 | Hirano et al. | 357/81 |
| 4,800,416 | 1/1989 | Musemeci | 357/34 |
| 5,018,000 | 5/1991 | Yamada et al. | 357/51 |
| 5,336,632 | 8/1994 | Imamura | 437/60 |
| 5,352,911 | 10/1994 | Grossman | 257/582 |
| 5,378,922 | 1/1995 | Sovero | 257/582 |
| 5,408,124 | 4/1995 | Palara | 257/582 |

FOREIGN PATENT DOCUMENTS

| | | |
|---|---|---|
| 0 182 400 A1 | 10/1985 | European Pat. Off. |
| 0 343 879 A2/A3 | 5/1989 | European Pat. Off. |
| 0 597 397 A2/A3 | 11/1993 | European Pat. Off. |

*Primary Examiner*—Carl Whitehead, Jr.
*Attorney, Agent, or Firm*—Lyon & Lyon LLP

[57] ABSTRACT

An apparatus and method are provided for bypassing the emitter ballast resistors of a power transistor, thereby increasing transistor gain. In a power transistor of the interdigitated type, bypassing the emitter ballast resistors requires bypassing each individual ballast resistor with a capacitor in parallel. Bypassing is therefore done on the silicon chip. More particularly, in accordance with one embodiment of the invention, an RF power transistor includes a silicon die, an emitter ballast resistor formed on the silicon die, and a bypass capacitor formed on the silicon die and connected in parallel with the emitter ballast resistor. The resistor may be a diffused resistor, and the capacitor may be a metal-on-polysilicon capacitor. In accordance with another embodiment of the invention, a method is provided for increasing the gain of an RF transistor formed on a silicon chip and having an emitter ballast resistor formed on the silicon chip, in which a capacitor is formed on the silicon chip and connected in parallel with the ballast resistor.

10 Claims, 2 Drawing Sheets

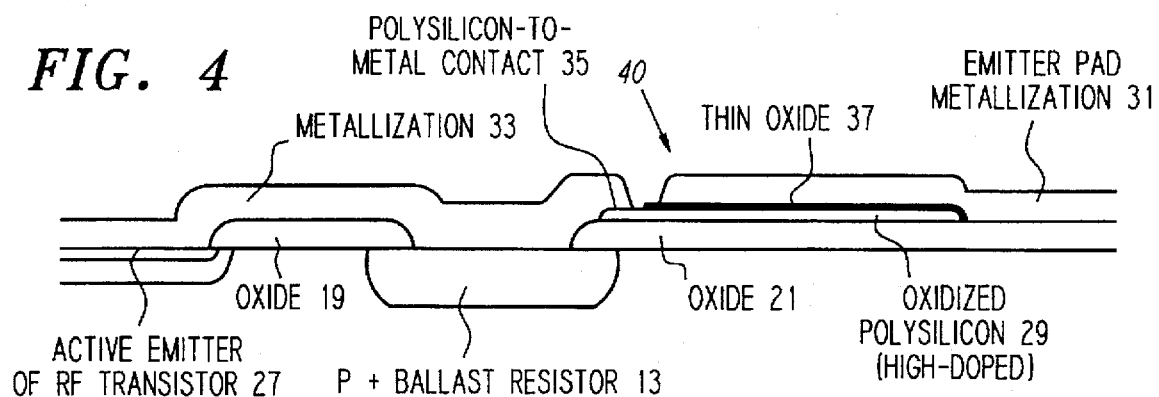
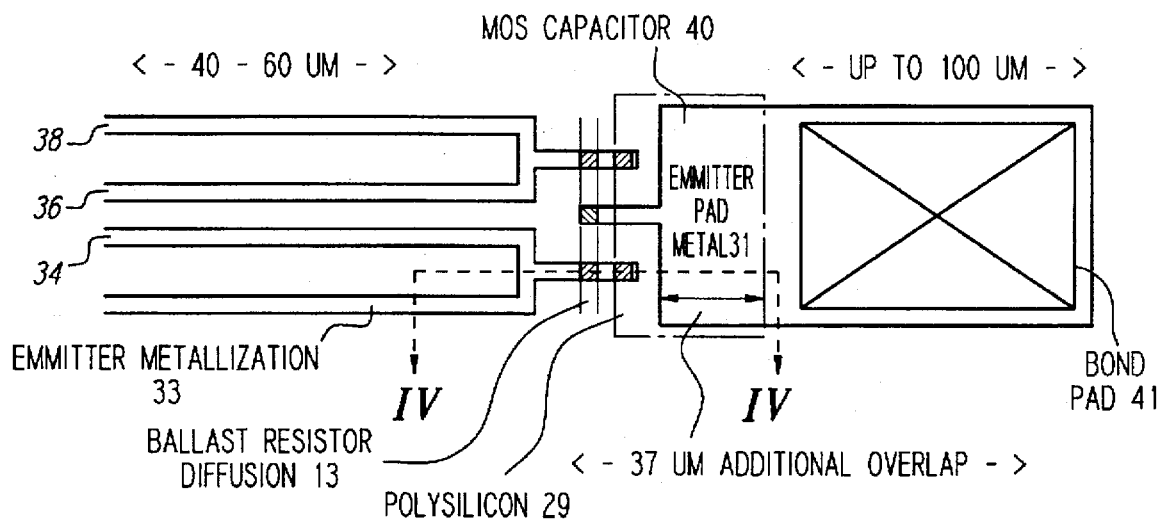
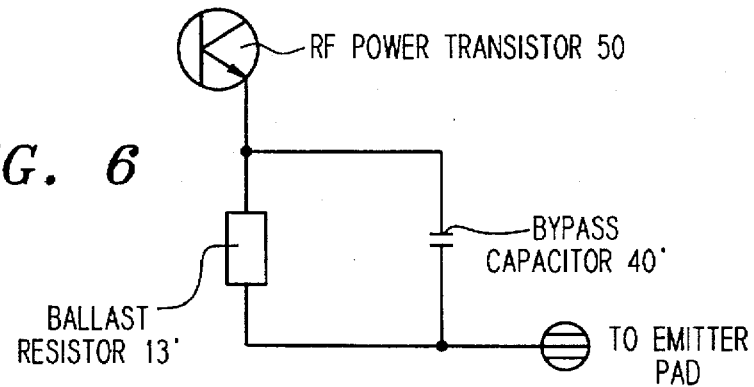

EMITTER BALLAST BYPASS FOR RADIO FREQUENCY POWER TRANSISTORS

BACKGROUND OF THE INVENTION

1. Field of the Invention

The present invention relates to power resistors, more particularly to radio frequency (RF) power resistors of the silicon bipolar type. Such resistors are commonly used in amplification stages for radio base station amplifiers, but are also widely used in other RF-related applications.

2. State of the Art

The majority of modern-day RF bipolar power transistors contain a large number of paralleled transistor segments to give a highpower capacity by distributing a large amount of current, reducing parasitics and providing heat spreading. The most common layout scheme, the interdigitated layout, consists of alternating fingers of base and emitter regions in parallel, connected by ribbons of metallization on top of the silicon.

Active bipolar transistors have a positive temperature coefficient. That is to say, as the temperature increases, the quiescent collector current increases. This condition occurs because the base-to-emitter voltage $V_{be}$ for a specified current decreases at a rate of approximately 0.002 volts per degree C. If the bias supply of the transistor is held constant and temperature increases, then $V_{be}$ decreases and collector current increases. This increase in collector current causes a further increase in power dissipation, which in turn causes the transistor junction temperature to increase even further. If there is no other influence, this condition causes the transistor to go into "thermal run away" wherein a current is reached at which the transistor fails.

There are a number of different ways to externally control this condition. The most common way is a circuit which senses the collector current and provides negative feedback to hold the collector current constant with changes in temperature. Another way is to use a temperature sensitive component in the bias network with a temperature characteristic the opposite of $V_{be}$. A third method is to use an emitter resistor to ground. As collector current increases, $V_{be}$ is reduced, and therefore the base current is reduced.

Any current external to the transistor itself adds complexity and increases the cost of the circuitry. The most cost-effective method of applying temperature compensation is the emitter-to-ground resistor. Although this method can be quite effective with respect to compensating for changes in ambient temperature, it is quite difficult to locate this resistor physically close enough to the transistor to minimize emitter lead inductance.

Semiconductor manufacturers have learned that the best place to locate the emitter resistor is on the silicon chip along with the active transistor. In this manner, the inductance in series with the emitter resistor is kept to a minimum. In the semiconductor industry, this emitter resistor is often referred to as the emitter ballast resistor, or just ballast resistor. In general, higher power density requires higher values of emitter ballast resistance.

Emitter ballast resistance, $r_e$, has a negative effect on power gain. Higher power gain is more desirable, as less input power is required for the same amount of output power.

Typically, the intrinsic emitter resistance of a bipolar transistor will be negligible compared to the emitter ballast resistance, such that the emitter resistance can be considered for practical purposes to be equal to the emitter ballast resistance alone. Using a simplified transistor model, the power gain of a bipolar transistor is given by the following equation:

$$\text{Gain(dB)} = 10 \log \beta \left( \frac{R_L}{r_e} \right)$$

where $\beta$ is the ratio of collector current to base current, $R_L$ is the collector load resistance, and $r_e$ is the emitter resistance. The foregoing model does not include higher frequency effects such as emitter lead inductance and does not include the possible negative effects of collector feedback capacitance on power gain. Even so, it has been determined empirically that in general, lower $r_e$ results in higher gain. In particular, under the foregoing model, each time $r_e$ is reduced by ½, gain is increased by 3 dB.

A common technique used in circuit design to negate the effects of $r_e$ on gain is to bypass $r_e$ with a capacitor. If the capacitor has a capacitive reactance equal to the value of $r_e$, then the total impedance of $r_e$ in parallel with the capacitor is reduced by ½. In this case, the bipolar transistor can be more accurately modelled as follows:

$$\text{Gain(dB)} = 10 \log \beta \left( \frac{R_L}{((r_e + X_C)/(r_e \cdot X_C))} \right)$$

As demonstrated by the foregoing observations, the negative effects on gain of the emitter ballast resistors can be overcome by bypassing the emitter ballast resistors. What is needed, then, is a technique for bypassing the emitter ballast resistors in a power transistor of the type described.

SUMMARY OF THE INVENTION

The present invention, generally speaking, provides an apparatus and method for bypassing the emitter ballast resistors of a power transistor, thereby increasing transistor gain. In a power transistor of the interdigitated type, bypassing the emitter ballast resistors requires bypassing each individual ballast resistor with a capacitor in parallel. Bypassing is therefore done on the silicon chip. More particularly, in accordance with one embodiment of the invention, an RF power transistor includes a silicon die, an emitter ballast resistor formed on the silicon die, and a bypass capacitor formed on the silicon die and connected in parallel with the emitter ballast resistor. In accordance with another embodiment of the invention, an RF power transistor includes a silicon die, and an interdigitated electrode formed on the silicon die having a plurality of parallel electrode fingers. Diffusion regions are formed beneath the electrode fingers. A resistor is formed on the silicon die and is connected in series with the electrode fingers at a first node. A metallized region, including a bond pad area, is formed on the silicon die and is connected by a metal path to the resistor at a second node. A conductive layer underlies the metallized region and is connected to the electrode fingers at the first node. An insulating layer separates the metallized region and the conductive layer. In accordance with still another embodiment of the invention, a method is provided for increasing the gain of an RF transistor formed on a silicon chip and having an emitter ballast resistor formed on the silicon chip, in which a capacitor is formed on the silicon chip and connected in parallel with the ballast resistor.

BRIEF DESCRIPTION OF THE DRAWING

The present invention may be further understood from the following description in conjunction with the appended drawing. In the drawing:

FIG. 4 is a sectional view of a polysilicon/oxide/metal MOS capacitor structure, shown integrated into a typical RF power transistor structure;

FIG. 5 is a detailed plan view of a layout for a bypass capacitor in an RF power transistor, in accordance with an embodiment of the present invention; and FIG. 6 is a diagram of an equivalent circuit of the MOS capacitor structure of FIG. 5.

DETAILED DESCRIPTION OF THE PREFERRED EMBODIMENTS

In order to capacitively bypass the emitter ballast resistors of a power transistor, a method of implementing a capacitor of high enough value to be significant is required. The MOS capacitor is the most commonly used in bipolar technology because the capacitor is extremely linear, has a high breakdown voltage, has a low temperature coefficient, and can be fabricated with good consistency of capacitance from transistor to transistor. Reverse-biased PN junctions can also be used, provided that the junction is always kept reverse-biased. However, large capacitance values require high doping levels, which lead to unacceptable breakdown voltages of the resulting structures.

Figure 1:
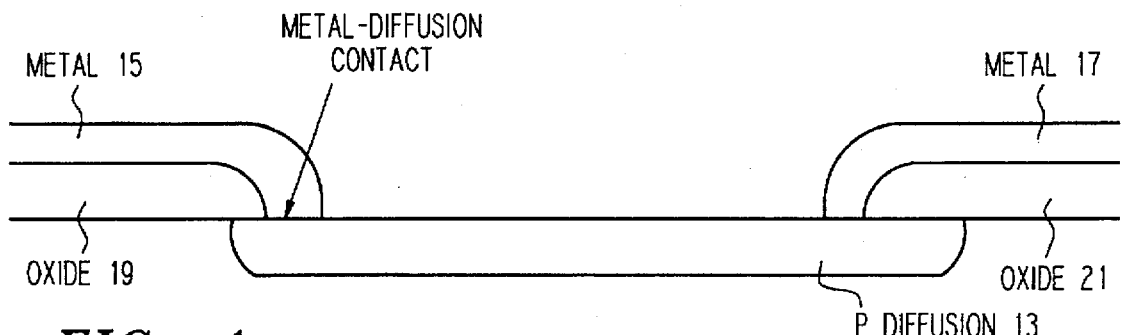
FIG. 1 is a sectional view of a conventional emitter ballast resistor in a bipolar power transistor.

Referring to FIG. 1, an emitter ballast resistor is formed (as in a conventional bipolar power transistor) by providing in an N-type substrate 11 a P-type diffusion region 13, connected at one end by a metal wire 15 to an emitter finger pair and connected at the other end by a metal wire 17 to an emitter bond pad (not shown). The metal wire 15 and the metal wire 17 (formed in the same metallization layer) are isolated from the substrate 11 by portions (19 and 21, respectively) of an oxide layer.

Figure 2:
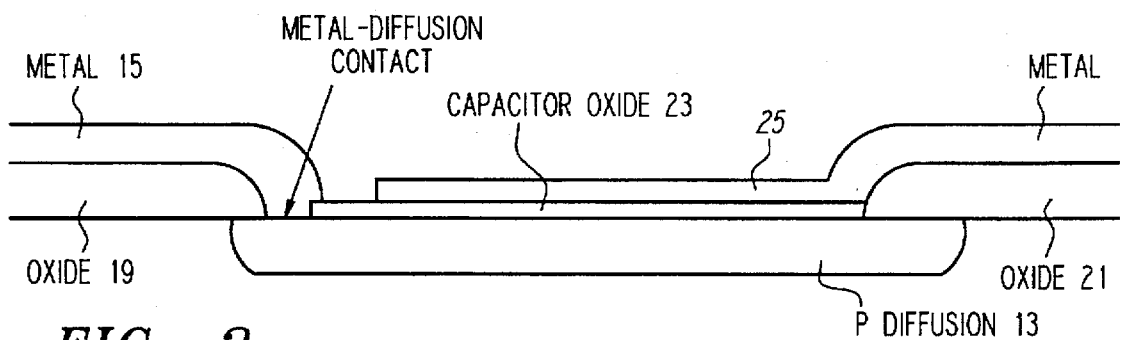
FIG. 2 is a sectional view of an emitter ballast resistor including an MOS bypass capacitor structure.

Referring to FIG. 2, the simplest way, in bipolar technology, to additionally provide an MOS capacitor is to insert in the process an additional mask step so as to define a region above the diffusion region 13 in which a thin layer of silicon dioxide 23 is grown. Metallization 25 is then placed over the thin oxide layer, producing a high-value, high-breakdown voltage capacitor.

Figure 3:
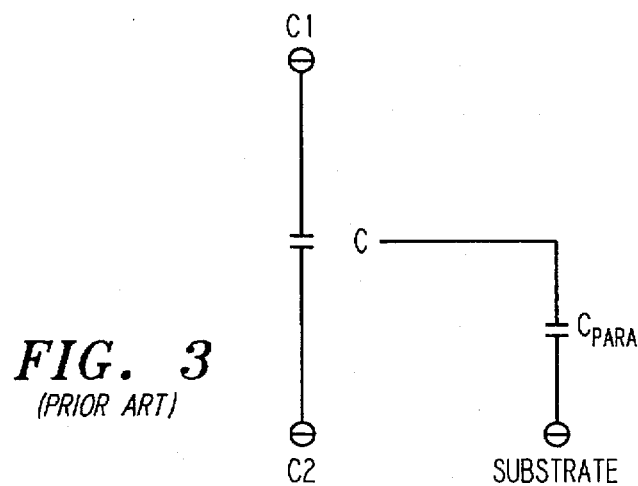
FIG. 3 is a diagram of an equivalent circuit of the MOS capacitor structure of FIG. 2.

However, as shown in FIG. 3, a considerable parasitic capacitance is present between the diffusion region 13 and the substrate region 11 (the transistor's collector) due to the depletion capacitance of the junction. In other words, the diffusion region 13 becomes one plate of a parasitic capacitor, and the substrate 11 becomes an opposite plate. The capacitance occupies the depletion region of the P/N junction, located at the interface between the diffusion region and the substrate. Such a parasitic capacitance is disadvantageous because it increases collector-to-emitter capacitance and because it decreases the bandwidth of the amplifier in which the transistor is used.

One way of lowering this parasitic capacitance is to use a polysilicon/oxide/metal capacitor. Referring to FIG. 4, and in accordance with the present invention, the N-type substrate 11, the P-type diffusion region 13 forming a p+ ballast resistor, and the oxide regions 19 and 21 are the same as in the conventional arrangement of FIG. 1. Also shown is an active emitter region 27 of an RF transistor. In contrast to the MOS capacitor of FIG. 2, a layer of highly doped polysilicon 29 is used to form the lower electrode of the capacitor, and is isolated from the substrate by the oxide region 21, which can be made several microns thick. As a result, the capacitance to the substrate is greatly reduced. A thin oxide layer 37 is grown above the polysilicon layer 29 and forms a dielectric between the capacitor plates (the polysilicon layer 29, and the emitter pad metallization 31). A metallization 33 connects a pair of emitter fingers to the ballast resistor 13 and also connects the ballast resistor 13 to the polysilicon layer 29.

The resulting polysilicon-to-metal capacitor 40 of FIG. 4 is an MOS capacitor having similar properties as the capacitor of FIG. 2. Only standard silicon processing steps are required to add the capacitor as shown in FIG. 4 into a typical high-frequency transistor process, including one or two additional mask steps. The polysilicon layer 29 should be heavily doped to minimize depletion effects in the capacitor electrode. That is, if the polysilicon is not heavily doped, the polysilicon may be depleted of carriers at certain voltage biases, causing capacitance in series with the oxide capacitance. This depletion leads to a lowering of the total capacitance and a voltage-dependent, very non-linear, capacitance value.

A simplified detail of a typical layout for the bypass capacitor 40 is shown in FIG. 5, here shown having only four emitters (33, 34, 36 and 38) connected to one bond pad 41. An actual transistor can consist of several hundred emitters connected to a bond pad. Line IV—IV indicates the cross section shown in FIG. 4. As compared to a conventional layout, the layout has been extended by adding a metal-on-polysilicon area 29, forming the MOS capacitor 40. The capacitor 40 will typically exhibit capacitance values up to 1 fF/μm².

The width of the metal-on-polysilicon capacitor 40 in FIG. 5 will depend on the capacitance value required. For example, if 50 pF is needed for a 1560 emitter finger layout to achieve an impedance of 1.6 Ohm at 2 GHz, then the width of the metal-on-polysilicon capacitor shown in FIG. 5 only needs to be 37 μm wide, if 300 Å silicon dioxide on top of the polysilicon is used. The increased size of the layout should be compared to a typical emitter finger dimension of 40–60 μm and a typical bond pad size of up to 100×100 μm.

The equivalent circuit of the layout is shown in FIG. 6, in which an RF power transistor 50 is connected to a ballast resistor 13' bypassed by a bypass capacitor 40'.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A power transistor formed on a semiconductor die, comprising:

a metallized region forming a first capacitive plate;

a conductive layer underlying said metallized region and forming a second capacitive plate;

a first insulating layer isolating said metallized region from said conductive layer and forming a dielectric therebetween, wherein said metallized region, said first insulating layer and said conductive layer form a plurality of capacitors;

regions of a conductive type of diffusion forming a plurality of resistors;

a second insulating layer separating said conductive layer from said regions of diffusion; and an interdigitated emitter electrode having a plurality of parallel electrode fingers, wherein respective electrode fingers of said plurality are connected in series to respective resistors, said respective resistors connected in parallel with respective capacitors.

2. The power transistor of claim 1, wherein said metallized region is connected to said regions of a conductive type of diffusion.

3. The power transistor of claim 1, wherein said first insulating layer comprises an oxide layer.

4. The power transistor of claim 1, wherein said metallized region includes a bond pad.

5. The power transistor of claim 1, wherein said conductive layer comprises doped polysilicon.

6. The power transistor of claim 1, wherein said second insulating layer comprises an oxide layer.

7. A power transistor formed on a semiconductor die, comprising:

an interdigitated emitter electrode;

an emitter ballast resistor connected in series with said emitter electrode; an insulating layer; and a bypass capacitor, wherein said bypass capacitor is connected in parallel with said emitter ballast resistor, and wherein said bypass capacitor is separated from said emitter ballast resistor by said insulating layer.

8. The power transistor of claim 7, wherein said insulating layer comprises an oxide layer.

9. The power transistor of claim 7, wherein said emitter ballast resistor comprises a diffused resistor.

10. The power transistor of claim 7, wherein said bypass capacitor comprises a metal-on-polysilicon capacitor.

\* \* \* \* \*